United States Patent [19]

Sartorius et al.

[11] 4,223,267

[45] Sep. 16, 1980

[54] CIRCUIT ARRANGEMENT FOR MEASURING PULSE WIDTHS

[75] Inventors: Wilfried Sartorius, Steinen; Don J. R. Stock, Schopfheim-Langenau, both of Fed. Rep. of Germany

[73] Assignee: Endress & Hauser GmbH & Co., Maulburg, Fed. Rep. of Germany

[21] Appl. No.: 918,385

[22] Filed: Jun. 23, 1978

[30] Foreign Application Priority Data

Jun. 29, 1977 [DE] Fed. Rep. of Germany ....... 2729422

[51] Int. Cl.$^2$ .............................................. G04F 8/00
[52] U.S. Cl. .................................... 368/118; 307/293
[58] Field of Search .................... 324/186, 78 D, 187, 324/83 D, 73 R, 77 A

[56] References Cited

U.S. PATENT DOCUMENTS 3,312,894 4/1967 Blake et al. ......................... 324/186
3,585,500 6/1971 Grubel ................................ 324/186

Primary Examiner—Michael J. Tokar
Attorney, Agent, or Firm—Gerald J. Ferguson, Jr.; Joseph J. Baker

[57] ABSTRACT

A pulse width measuring apparatus including a threshold-level trigger, which receives the pulses to be measured and a threshold voltage. At the instant at which the pulse voltage exceeds the threshold voltage the threshold-level trigger starts a time-measuring device which is arrested at the end of each pulse, so that the measured time indicates the pulse width. The threshold voltage is supplied by the tapping of a voltage divider which is connected to the output of a sample and hold circuit that is triggered after the end of the rising flank of each pulse to sample and store the value of the pulse amplitude. According to a preferred embodiment, a similar arrangement is provided for arresting the time-measuring device when the pulse voltage falls below a second threshold voltage.

8 Claims, 3 Drawing Figures

CIRCUIT ARRANGEMENT FOR MEASURING PULSE WIDTHS

This invention relates to a circuit arrangement for measuring pulse widths, including a threshold trigger which receives the pulse to be measured and a threshold voltage and initiates a time-measuring arrangement at the instant in which the pulse voltage exceeds the threshold voltage, and including an arrangement for arresting the time-measuring arrangement at the end of each pulse.

In circuit arrangements of this kind the time measured by the time-measuring arrangement between its being initiated and its being arrested is a measure of the pulse width. It is usual for the time-measuring arrangement to consist of a pulse counter, to which are applied over a gate circuit clock pulses provided by a standard clock pulse generator, the repetition period of which is small compared with the time to be measured, the gate circuit is opened by the output signal of the threshold-level trigger and is closed at the end of each pulse. When the pulses are rounded-off as a result of too-large time constants in the transmission system or in the measuring system, errors result in the measurement of the pulse width, since the time-measuring arrangement is not set in operation at the correct point of the rising flank of the pulse and arrested again at the correct point of the falling flank. The instant of setting in action is determined by the threshold level of the threshold-level trigger and usually the instant of arresting the time-measuring arrangement is also determined by the pulse voltage falling again below a fixed threshold voltage. Measurement errors can thus arise because the threshold voltages are not appropriately determined. Even with correct determination of the threshold levels for a particular pulse amplitude, however, measurement errors occur if the pulse amplitude changes. A further source of error consists in the signal voltage not falling again to the initial value after the end of an pulse, but to a value different from the initial value.

The object of the invention is to provide a circuit arrangement for pulse width measurement which yields a correct pulse width measurement even when the pulse amplitudes alter or when the signal voltage after the end of the pulse has a value different from that before the beginning of the pulse. Starting from a circuit arrangement of the known kind described above, this object is satisfied, in accordance with the invention, by an instantaneous value store which is triggered after the end of the rising flank of each pulse to sample and store the value of the amplitude pulse, and through a voltage divider connected to the output of the instantaneous value store, of which the tapping is connected with the threshold voltage input of the threshold-level trigger.

The circuit arrangement in accordance with the invention provides the effect that the threshold value, which is decisive for the setting into operation of the time-measuring arrangement, is always set at a value which has a definite relation to the pulse amplitude and is preferably equal to half the impulse amplitude of the arriving pulses. As long as the pulse amplitude does not change substantially from one pulse to the next, which can usually be assumed, the time-measuring arrangement is thus always set in operation at an instant which ensures a correct pulse width measurement. For gradual fluctuations of the pulse amplitude this instant adapts itself to the alterations of the pulse amplitude.

In order to terminate the time measurement at the correct instant, the circuit arrangement according to the invention advantageously contains a second threshold-level trigger, which receives the pulses to be measured and a second threshold voltage and arrests the time-measuring arrangement at the instant in which the pulse voltage falls below the second threshold voltage. The determination of the second threshold-level to the value necessary for the correct pulse width measurement results in this case by a second instantaneous value store, which is initiated after the end of the falling flank on each pulse to sample and store the pulse amplitude value, and through an adding circuit connected to the output of the two instantaneous value stores, which yields at an output connected with the threshold value input of the second threshold-level trigger a voltage which lies midway between the output voltages of the two instantaneous value stores.

This construction provides the effect, that the arrest of the time-measuring arrangement is effected at the instant at which the signal voltage lies exactly at half the height of the falling flank, and in fact even when the signal voltage at the end of the falling flank lies at a value different from zero or from the initial value. Thus a correct measurement of the pulse width is ensured independent of the amplitude fluctuations and independent of the values of the signal voltage before and after each impulse. An embodiment of the invention is described with reference to the accompanying drawings, in which:

Figure 1:
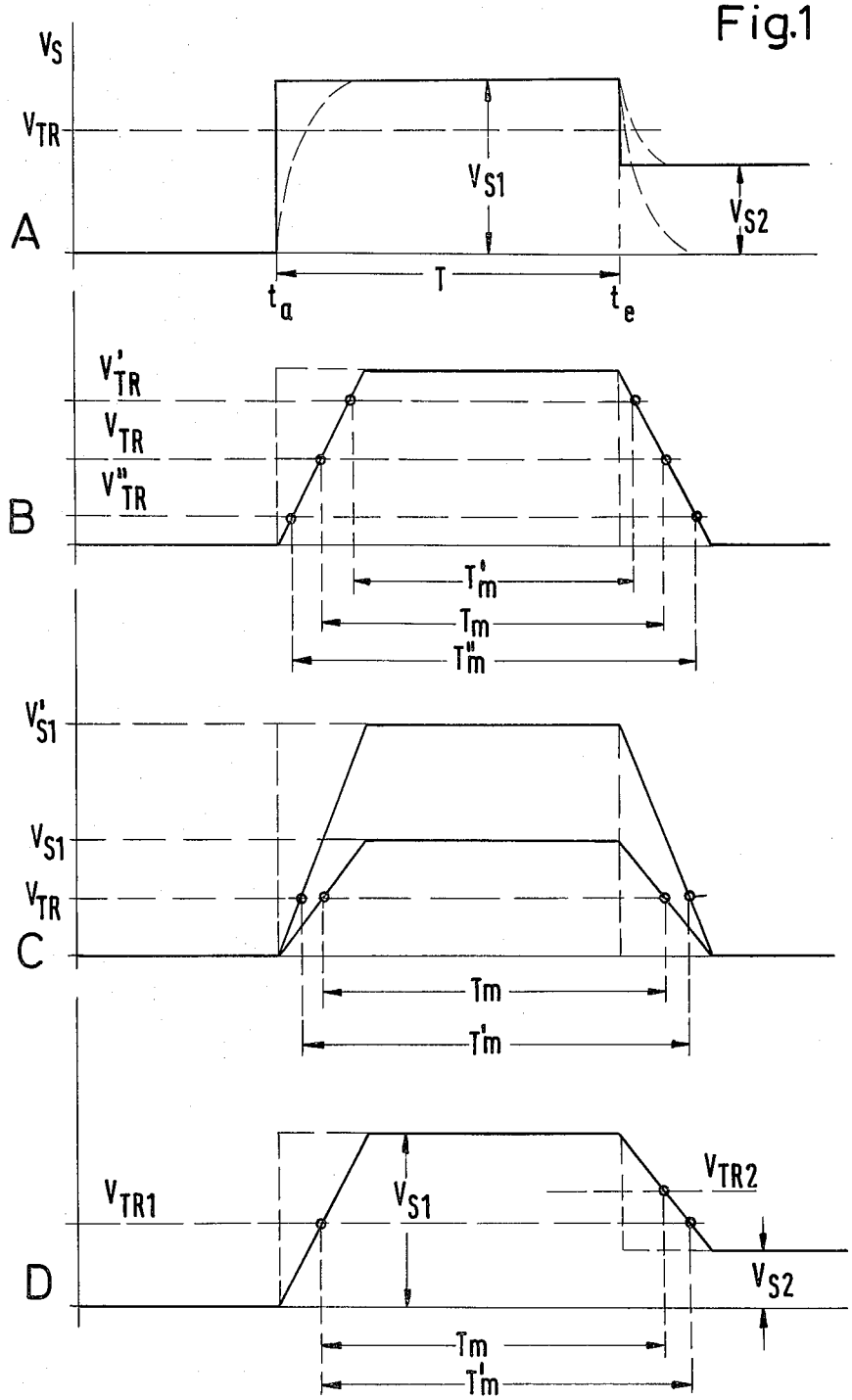
FIG. 1 shows diagrams for explaining the errors occurring in pulse width measurement.

The diagram A of FIG. 1 shows a rectangular pulse of width T and of amplitude $V_{S1}$. The pulse commences at instant $t_a$ and ends at instant $t_e$. The measurement of the pulse width T may be effected by setting in operation at the instant $t_a$ a timer which counts clock pulses of standard repetition frequency and is arrested at the instant $t_e$. The number of the pulses counted is then a measurement for the pulse width T. The control of the counter may be effected for example by a threshold-level trigger, which sets the counter in operation when the signal voltage $V_s$ exceeds a fixed preset threshold level $V_{TR}$, and which arrests the counter again when the signal voltage falls again below the threshold value $V_{TR}$. For vertical pulse flanks, these instants agree exactly with the initial and final instants $t_a$ and $t_e$ of the pulse, so that the measurement of the pulse width T is effected without measurement error. This measurement would also be effected perfectly if the pulse amplitude $V_{S1}$ alters or when the signal voltage at the end of the pulse did not fall to the initial value (which in the illustrated example is the value 0), but to some different value $V_{S2}$, on the assumption that the threshold value $V_{TR}$ lies between the voltage levels $V_{S1}$ and $V_{S2}$.

Because of the limited bandwidth of the transmission systems and/or of the measurement system, rectangular pulses with vertical rising and falling edges are not commonly available for the pulse width measurement; owing to the time constants present the pulses are rounded-off so that their pulse flanks rise and fall exponentially, as is shown in broken line in FIG. 1A.

In the diagram B, C and D of FIG. 1 measurement errors are illustrated which can arise when the pulse flanks are rounded-off. For simplicity in illustration, the pulse flanks in these diagrams are not shown as exponential, but as linear. As may be seen from diagram 1B, the measured pulse width $T_m$ corresponds exactly to the pulse width T of the original rectangular pulse, when the threshold value $V_{TR}$, at which the counter is set going and arrested again, lies exactly at half the height of the rising and of the falling flanks. For a higher threshold value $V'_{TR}$ the measured pulse width $T'_m$ is too short and for a lower threshold value $V''_{TR}$ the measured pulse width $T''_m$ is too long.

As shown by the diagram given in FIG. 1C, for a fixed threshold value $V_{TR}$, errors in measurement also result when the pulse amplitude is subjected to fluctuations. When the threshold value $V_{TR}$ is adjusted, for example, so that it lies at half the height of the flanks for an pulse of amplitude $V_{S1}$ and thus corresponds to the correct value T for the measured pulse width $T_m$, the same threshold value $V_{TR}$ gives an incorrect pulse width $T'_m$ for another impulse of amplitude $V'_{S1}$.

The diagram D of FIG. 1 shows the errors in measurement, which can be occasioned when the signal voltage at the end of the pulse does not fall to the initial value zero, but to another value $V_{S2}$. If in this case the pulse width is measured in accordance with the above-described principle, with a single fixed threshold level $V_{TR1}$, which is set at half the height of the rising flanks, the measured pulse width $T'_m$ is too large. In order to avoid a measurement error in this case, the threshold value $V_{TR2}$ at which the counter is arrested, must lie at half the height of the falling flanks and must thus be displaced from the threshold value $V_{TR1}$.

Figure 2:
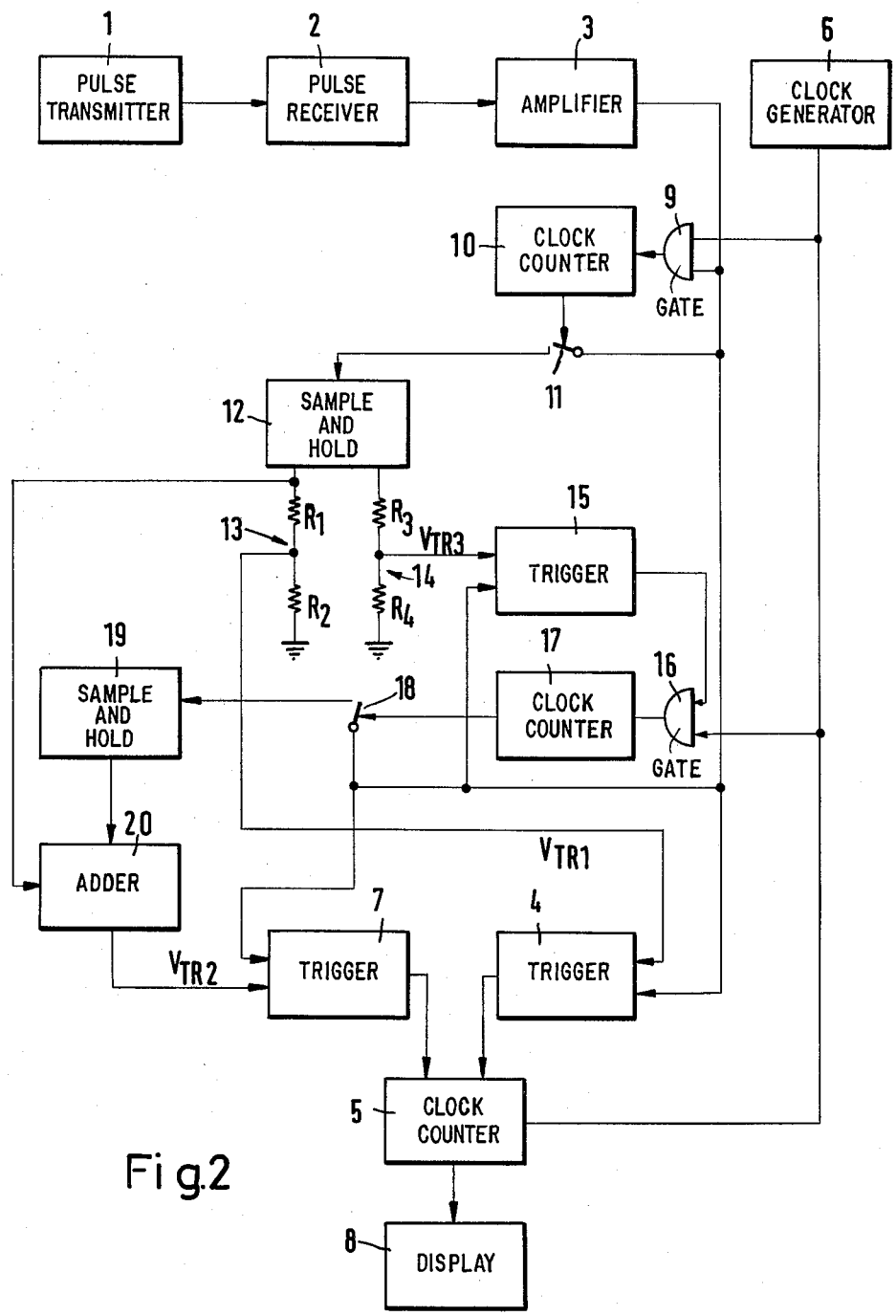
FIG. 2 shows a circuit arrangement for pulse width measurement in which the errors explained with reference to FIG. 1 are avoided.

In FIG. 2 there is illustrated a circuit arrangement with which the above-described errors in measurement may be avoided.

It is assumed, that the pulses to be measured are provided by a pulse transmitter 1 and after reception by a pulse receiver 2 and amplification in an amplifier 3 are available in rounded-off form with slanting or exponentially rising and falling flanks. To measure the pulse width the pulses of amplitude $V_S$ appearing at the output of the amplifier 3 are applied to the signal input of a threshold-level trigger 4, which receives a threshold voltage $V_{TR1}$ at a threshold voltage input. As soon as the rising flank of the pulse exceeds the threshold voltage $V_{TR1}$, the threshold-value trigger 4 yields a signal which sets a clock pulse counter 5 in operation. The clock pulse counter 5 receives at its counter input clock pulses which are provided by a clock pulse generator 6 of constant repetition frequency. The repetition period of the clock pulses is sufficiently small as compared with the pulse width to be measured, so that within the duration of each pulse the number of pulses counted in the pulse counter 5 corresponds to the desired accuracy of measurement.

The pulses provided from the output of the amplifier 3 are also applied to the signal input of a second threshold value trigger 7, which receives at its threshold value input a threshold voltage $V_{TR2}$. When as the pulse flank falls, the voltage drops below the threshold level $V_{TR2}$, the threshold-level trigger 7 yields a signal that stops the clock pulse counter 5. The number of pulses counted in the clock pulse counter 5 is then a measurement of the pulse width; the counter state of the counter 5 and thus the pulse width may be displayed by a display device 8.

The above-described circuit elements correspond to the usual arrangement for measurement of pulse widths by counting clock pulses. These arrangements yield the measurement errors explained with reference to FIG. 1, when the threshold voltages $V_{TR1}$ and $V_{TR2}$ have a fixedly set value.

The part of the circuit arrangement of FIG. 2 now to be described provides a continuous adjustment of the threshold voltages $V_{TR1}$ and $V_{TR2}$ in such a manner that the errors in measurement described are avoided and the measurement of the pulse width is always effected accurately.

For this purpose the pulses provided by the amplifier 3 are applied to the control input of a gate circuit 9, which receives at its signal input the clock pulses delivered by the clock pulse generator 6 and of which the output is connected with the input of a further clock pulse counter 10. The clock pulse counter 10 is set before the beginning of each measurement, by an arrangement which is not shown, so that after counting a fixed number of clock pulses it briefly closes a switch 11, which for simplicity is shown as a mechanical contact, but in practice would usually be constructed as an electronic switch. The switch 11 connects an instantaneous value store 12 briefly with the output of the amplifier 3. The instantaneous value store 12 is a circuit known in Anglo-Saxon literature under the designation "sample an hold device", which samples a briefly applied voltage and stores the sampled value until the next sampling. The instantaneous value store 12 thus holds the instantaneous value of the pulse voltage at the instant of closing of the switch 11.

To the output of the instantaneous value store 12 there is connected a voltage divider 13, which consists of two similar resistors $R_1$ and $R_2$. The voltage appearing at the tapping of the voltage divider 13 is applied as threshold voltage $V_{TR1}$ to the threshold voltage input of the threshold-level trigger 4.

To the output of the instantaneous value store 12 there is further connected a second voltage divider 14, which consists of two resistors $R_3$ and $R_4$, the resistor $R_3$ being of substantially lower value than the resistor $R_4$. At the tapping of the voltage divider 14 there is thus available a voltage which is only negligibly smaller than the instantaneous voltage stored in the instantaneous value store 12. This voltage is applied as the threshold voltage $V_{TR3}$ to the threshold voltage input of the threshold-level trigger 15, of which the signal input receives the pulses provided by the amplifier 3. The threshold-level trigger 15 is so arranged that it provides a voltage at its output when the pulse voltage applied to its signal input is below the value of the threshold voltage $V_{TR3}$. This voltage is applied to the control input of a gate circuit 16, which receives at its signal input the clock pulses from the clock pulse generator 6. The output of the gate circuit 16 is connected with the counter input of a clock pulse counter 17. Similarly to the clock pulse counter 10, the clock pulse counter 17 is so arranged that it is set before the beginning of each measurement to a predetermined counter condition and yields a signal at its output when the number of counted pulses corresponds to the pre-set counter condition. This output signal is arranged briefly to close a switch 18, which connects a second instantaneous value store 19 with the output of the amplifier 3. Thus the instantaneous value of the pulse voltage at the instant of closing of the switch 18 is stored in the instantaneous value store 19.

The outputs of the two instantaneous value stores 12 and 19 are connected with the two inputs of an adding circuit 20, which is so arranged that it provides at its output half the sum of the voltages applied to its two inputs. This output voltage is applied as the threshold voltage $V_{TR2}$ to the threshold value input of the threshold-level trigger 7.

Figure 3:
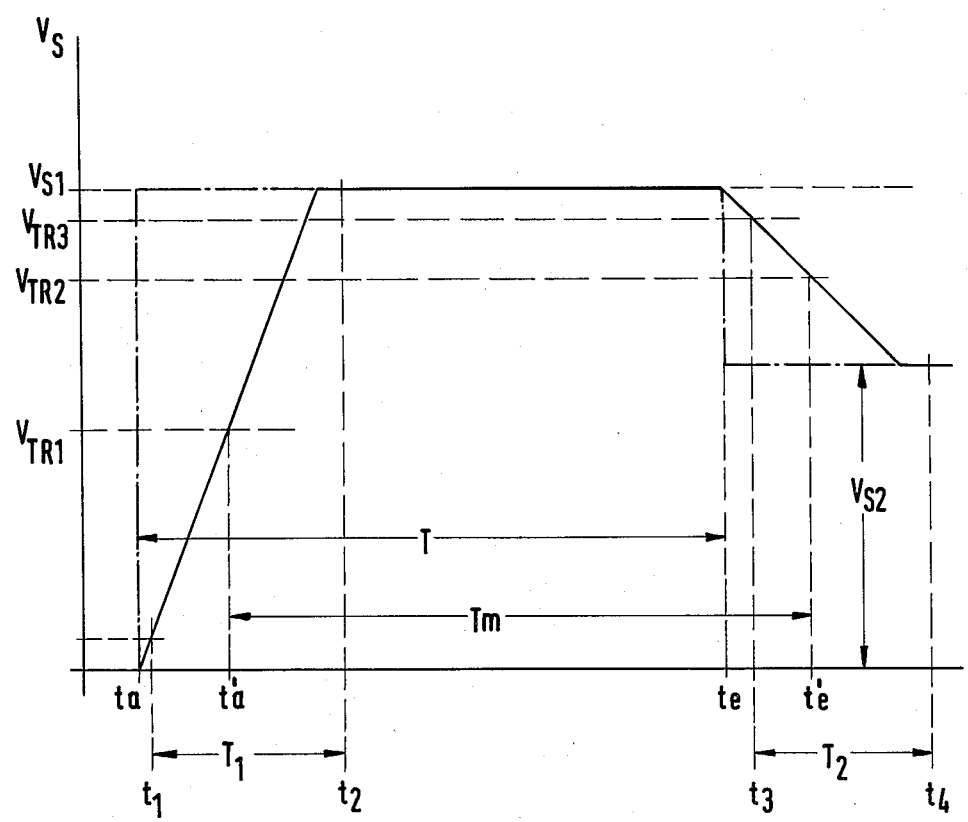
FIG. 3 shows a diagram explanatory of the mode of operation of the circuit arrangement of FIG. 2.

The mode of operation of the circuit of FIG. 2 will now be explained with reference to the diagrams given in FIG. 3. FIG. 3 shows in dot-dash line a rectangular pulse provided by the pulse transmitter 1, which commences at instant $t_a$ and ends at instant $t_e$ the pulse rises from value 0 to the amplitude $V_{S1}$, but does not, however, fall again to the initial value 0, but only to a higher voltage level $V_{S2}$.

There is shown in full line in FIG. 3 the pulse appearing at the output of the amplifier 3, with rounded-off flanks, the rising and falling of flanks being shown for simplicity only as being linear, although in practice they would usually have an exponential form, such as has been explained above with reference to FIG. 1. This difference is, however, insignificant as regards the explanation of the mode of operation of the arrangement.

At instant $t_1$ shortly after the beginning of the pulse, the pulse voltage has reached a value which corresponds to the response threshold of the gate circuit 9, so that from this instant onwards counting of the clock pulses is effected in the clock pulse counter 10. The clock pulse counter 10 is before the beginning of the measurement set to a counter state that corresponds to a time duration $T_1$, which is greater than the greatest expected duration of the rising pulse flank, so that after expiry of the time $T_1$, at the instant $t_2$, the pulse will definitely have attained its full amplitude $V_{S1}$. At instant $t_2$ the clock pulse counter 10 briefly closes the switch 11, so that the instantaneous value $V_{S1}$ existing at this instant is stored in the instantaneous value store 12. From this instant onwards there appears at the tapping of the voltage divider 13 a voltage which is exactly half the pulse amplitude $V_{S1}$, so that the value of the threshold voltage $V_{TR1}$ at the threshold voltage input of the threshold-level trigger 4 is given by $V_{TR1} = V_{S\frac{1}{2}}$. In addition, there appears at the tapping of the voltage divider 14 a threshold voltage $V_{TR3}$, which is slightly below the pulse amplitude $V_{S1}$.

If after the termination of the pulse the voltage of the falling flank falls at the instant $t_3$ below the level of the threshold voltage $V_{TR3}$, the threshold-level trigger 15 yields a voltage which opens the gate circuit 16, so that the clock pulse counter 17 commences to count the clock pulses. Before the beginning of the measurement the clock pulse counter 17 is set to a counter state which corresponds to a time duration $T_2$, which is greater than the duration of the longest falling pulse flank to be expected. Thus when after counting a number of pulses corresponding to the time $T_2$, the clock pulse counter 17 briefly closes the switch 18 at the instant $T_4$ the signal voltage has reached the value $V_{S2}$, which is now stored in the instantaneous value store 19.

The adding circuit 20 thus receives at its two inputs the voltages $V_{S1}$ and $V_{S2}$, and it provides to the threshold voltage input of the threshold-level trigger 17 the threshold voltage $V_{TR2} = (V_{S1} + V_{S2})/2$. This threshold voltage lies exactly at half the height of the falling flank of the pulse no matter what value $V_{S2}$ the signal voltage assumes after the end of the pulse.

Thus for measuring the next pulse the clock pulse counter 5 is set in operation at the instant $t'_a$, at which the voltage of the rising pulse flank attains the threshold voltage $V_{TR1}$. If it is assumed that the pulse amplitude $V_{S1}$ has not substantially altered as compared with the preceding pulse, the instant $t'_a$ at the beginning of the measurement thus corresponds exactly to the instant for the correct time measurement.

At the instant $t_2$ there again is effected the storage of the instantaneous value $V_{S1}$ of the immediately applied pulse, so that the threshold level $V_{TR1}$ for the measurement of the next pulse is determined.

The counter 5 is arrested at the instant $t'_e$, at which the voltage of the falling pulse flank attains the threshold voltage $V_{TR2}$ given by the adding circuit 20. Finally, at instant $t_4$ the signal value $V_{S2}$ is again stored in the instantaneous value store 19, so that the threshold voltage $V_{TR2}$ for the measurement of the next pulse is determined.

FIG. 3 allows it to be immediately recognised that the time $T_m$ between the instants $t'_a$ and $t'_3$ measured by the counting of the clock pulses in the clock pulse counter 5 is exactly equal to the pulse width T between the instants $t_a$ and $t_e$. The pulse width measurement is thus effected exactly, regardless of the fact that the pulse flanks do not rise and fall vertically, and that the signal voltage after the end of the pulse does not correspond to the initial value. The circuit yields a correct measurement of the pulse width as soon as the second pulse of an pulse train and the measurement is correct, provided that the pulse amplitude does not alter substantially from one pulse to the next, which can usually be assumed.

Should however the pulse amplitude abruptly vary by a considerable amount between two successive pulses, then the pulse width measurement will again be correct after the next but one pulse.

It can be observed immediately, that the described circuit will also operate correctly when the signal voltage after the end of the pulse again falls to the initial value 0. In this case however the same threshold voltage $V_{TR1}$ could be employed for the two threshold-level triggers 4 and 7, so that the circuit components 14, 15, 16, 17, 18, 19 and 20 could be omitted.

What we claim is:

1. Pulse width measuring apparatus for measuring the widths of pulses in a pulse train comprising a threshold-level trigger responsive to pulses having rising and falling edges for generating a first output signal each time the rising edge of a pulse rises above a first threshold voltage, means responsive to said pulses for generating a second output signal each time the falling edge of a pulse falls below a second threshold voltage, time-measuring means for measuring the time duration between said first and second output signals, first means for sampling and holding the value of the amplitude of each pulse and a voltage divider connected to the output of the sample and hold means, the tapping of which establishes the threshold voltage of the threshold-level trigger.

2. Apparatus in accordance with claim 1 wherein the voltage divider has the dividing ratio of 1:2.

3. Apparatus in accordance with claim 1 including further time-measuring means substantially responsive to the beginning of the rising edge of each pulse to generate a control signal after the greatest expected duration of the rising edge and means responsive to said control signal for applying said pulse to said sample and hold means so that the amplitude of the pulse can be sampled and held.

4. Apparatus in accordance with claims 1, 2 or 3 where said means for generating the second output signal includes a second threshold-level trigger.

5. Apparatus in accordance with claim 4 including a second sample and hold means which is initiated after the end of the falling edge of each pulse to sample and hold the value of the pulse, and an adding circuit connected to the outputs of the two sample and hold means for establishing the threshold voltage of the second threshold-level trigger as the median between the outputs of the two sample and hold means.

6. Apparatus in accordance with claim 5 including third time-measuring means substantially responsive to the beginning of the falling edge of each pulse to generate a second control signal after the greatest expected duration of the falling edge and means responsive to said second control signal for applying said pulse to said second sample and hold means after the falling edge of the pulse.

7. Apparatus in accordance with claim 6 including a second voltage divider having a division ratio approximately equal to 1 responsive to said first sample and hold means and a third threshold-level trigger responsive to said pulses for generating a third output signal each time the falling edge of a pulse falls below a third threshold voltage established by the tapping of the second voltage divider, and means responsive to said third output signal for initiating the operation of said third time-measuring means at said beginning of the falling edge of each pulse.

8. A circuit arrangement in accordance with claim 7 wherein the third time-measuring means includes a counter, which counts pulses provided by a clock-pulse generator.

* * * * *